United States Patent [19]
Ameen et al.

[11] Patent Number: 5,321,884
[45] Date of Patent: Jun. 21, 1994

[54] MULTILAYERED FLEXIBLE CIRCUIT PACKAGE

[75] Inventors: Joseph G. Ameen, Apalachin; Joseph Funari, Vestal; David W. Sissenstein, Jr., Endwell, all of N.Y.

[73] Assignee: International Business Machines Corporation, Armonk, N.Y.

[21] Appl. No.: 65,129

[22] Filed: May 20, 1993

Related U.S. Application Data

[62] Division of Ser. No. 823,914, Jan. 22, 1992, Pat. No. 5,241,454.

[51] Int. Cl.$^5$ .............................................. H05K 3/36
[52] U.S. Cl. .................................. 29/830; 228/180.1; 228/220; 439/67; 439/75
[58] Field of Search .................... 228/180.1, 187, 220, 228/255; 29/830; 439/67, 75

[56] References Cited

U.S. PATENT DOCUMENTS

| | | | |
|---|---|---|---|
| 4,059,849 | 11/1977 | Mitchell | 361/412 |
| 4,593,959 | 6/1986 | Simms | 439/75 |
| 4,750,092 | 6/1988 | Werther | 29/830 |
| 4,788,767 | 12/1988 | Desai et al. | 29/830 |
| 4,842,184 | 6/1989 | Miller | 228/255 X |
| 5,048,166 | 9/1991 | Wakamatsu | 228/180.2 X |
| 5,222,014 | 6/1993 | Lin | 228/180.2 X |

FOREIGN PATENT DOCUMENTS 86159  3/1990  Japan ........................ 357/75

OTHER PUBLICATIONS

IBM Technical Disclosure Bulletin, vol. 26 No. 12 May 1984 p. 6637, "Multi-layer Flexible Film Module", by McBride.

Primary Examiner—Kenneth J. Ramsey
Attorney, Agent, or Firm—Lawrence R. Fraley

[57] ABSTRACT

An electronic package which includes a rigid first substrate (e.g., ceramic) having a plurality of conductive pins spacedly located therein. These pins each include one end portion extending below an undersurface of the substrate for positioning and electrically coupling within a second substrate (e.g., printed circuit board), while also including an opposite end portion which projects from an opposite, upper surface of the first substrate. These upwardly projecting end portions are designed for accommodating, in stacked orientation, a plurality of thin film, flexible circuitized substrates thereon, each of these substrates being electrically coupled to a respective pin, if desired, using a solder composition. In one example of the invention, solder hierarchy for various solders is used, one solder being used to connect the substrates and respective pins, and a second solder (having a higher melting point and different composition from the first solder) used to connect the semiconductor devices (chips) of the flexible circuitized substrates to the conductive circuitry of the substrates. Hydrogen is preferably used to effect solder reflow for the solder which couples the flexible substrates to the respective pins. In an alternate embodiment, the flexible circuitized substrates may include at least two separate conductive layers as part thereof.

10 Claims, 1 Drawing Sheet

MULTILAYERED FLEXIBLE CIRCUIT PACKAGE

This is a divisional of copending application(s) Ser. No. 07/823,914 filed on Jan. 22, 1992, now U.S. Pat. No. 5,241,454.

TECHNICAL FIELD

The invention relates to electronic packaging structures and particularly to such structures which utilize thin film, flexible circuitized substrates as part thereof. Even more particularly, the invention relates to such packaging structures which may be utilized in the information handling systems (computer) field.

BACKGROUND OF THE INVENTION

Various electronic packaging structures are known in the art including, for example, those shown and described in U.S. Pat. No. 4,849,856 (Funari et al), U.S. Pat. No. 4,914,551 (Anschel et al), U.S. Pat. No. 4,962,416 (Jones et al) and U.S. Pat. No. 4,965,700 (McBride). Such packaging structures, as defined in these patents, typically utilize at least one thin film, flexible circuitized substrate as part thereof. Typically, such circuitized substrates include a thin dielectric (e.g., polyimide) layer having at least one circuit layer (e.g., chrome-copper-chrome) thereon. Such thin film, flexible circuitized substrates may be positioned on and electrically coupled to another circuitized substrate (e.g., printed circuit board) to thereby electrically couple a semiconductor device (chip) which is connected to respective portions of the thin film, circuitized substrate's circuitry to corresponding circuitry on the additional substrate. The aforementioned U.S. Pat. Nos. 4,849,856, 4,914,551 and 4,962,416 are representative examples of such packaging structures which utilize this means of connection.

Thin film, flexible circuitized substrates as produced today possess several distinct advantages (e.g., high density, flexibility, relative ease of manufacture, etc.) desired in the information handling systems field.

Another type of packaging structure known in the art includes those structures which utilize a ceramic or the like substrate which may include various levels of circuitization therein/thereon as part thereof, in addition to a plurality of connecting pins (e.g., copper) projecting from a bottom surface thereof such that this structure may be positioned within a female, receiving electrical circuitized member such as a printed circuit board or the like. Examples of such packaging structures which include a ceramic base or substrate member as part thereof are described in U.S. Pat. No. 4,072,697 (Spaight), U.S. Pat. No. 4,221,047 (Narken), U.S. Pat. No. 4,626,960 (Hamano et al), U.S. Pat. No. 4,652,977 (Jones) and U.S. Pat. No. 4,322,778 (Barbour et al). As shown in these patents, the various conductive pins typically project from an under side of the ceramic base or substrate for eventual coupling to such an associated circuit member. In more enhanced versions of these ceramic substrate packaging structures, the opposing upper surface of the ceramic includes a circuitized portion of various conductive (e.g., chrome-copper-chrome) layers, each located on a suitable dielectric (e.g., polyimide) layer. In some more recent examples, a total of two circuit layers may be utilized.

As will be understood from the following description, the present invention combines the several advantageous features of thin film, flexible circuitized packaging structures with those of the earlier, more ruggedized packaging structures which utilize a ceramic or the like substrate having appended pins as part thereof. The result is a significant expansion in the functional capabilities of such earlier packaging structures while simultaneously expanding the uses for thin film, flexible circuitized substrates of the type defined herein.

It is believed that an electronic packaging structure possessing the above advantageous features and others readily discernible from the teachings herein would constitute a significant advancement in the art.

DISCLOSURE OF THE INVENTION

It is, therefore, a primary object of the invention to enhance the art of electronic packaging by providing a package possessing the several advantageous features defined herein and discernible from the description provided herewith.

In accordance with one aspect of the invention, there is provided an electronic package which comprises a substantially rigid first substrate including a first surface and at least two electrically conductive pins spacedly located within the substrate, the pins including at least one end portion which projects above this first surface, a plurality of thin film, flexible circuitized substrates positioned in stacked orientation above the first substrate's first surface on the conductive pin projecting end portions, and means for electrically connecting the circuitry of the circuitized substrates to the respective, conductive pins. Selected ones of the thin film, circuitized substrates each include at least one dielectric layer and at least one layer of circuitry on the dielectric layer and further include at least one semiconductor device positioned on the flexible substrate and coupled, electrically, to the circuitry thereon. These selected ones of the flexible circuitized substrates further include at least two apertures spacedly located therein, each adapted for having a respective one of the projecting end portions of the pins located therein, with the aforedefined electrically connecting between the circuitized substrate's circuitry and pins occurring in the region of these substrates.

In accordance with another aspect of the invention, there is provided a method of making an electronic package which comprises the steps of providing a substantially rigid first substrate including at least two conductive pins spacedly located therein which project from a first surface of the substrate, positioning a plurality of thin film, flexible circuitized substrates in stacked orientation on these projecting end portions of the pins, and electrically connecting the circuitry of the circuitized substrates to these conductive pins. Selected ones of these substrates, in addition to including such circuitry, further include at least one dielectric layer having the circuitry thereon and at least one semiconductor device positioned on this substrate and electrically coupled to its circuitry.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
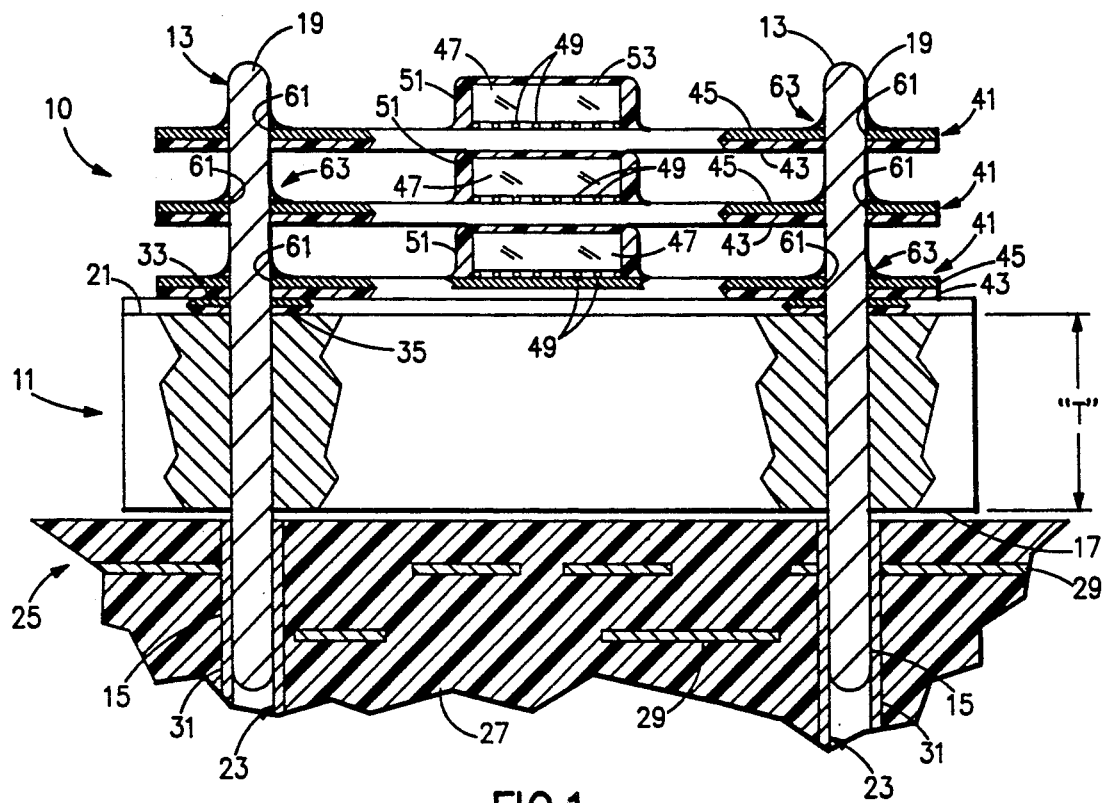
FIG. 1 is an elevational view, in section and on an enlarged scale, of an electronic package in accordance with a preferred embodiment of the invention.

In FIG. 1, there is shown an electronic package 10 in accordance with a preferred embodiment of the invention. Package 10 includes a substantially rigid first substrate 11, preferably of ceramic material, having a plurality of conductive (e.g., copper) pins 13 located spacedly therein. Substrate 11 is preferably of a ceramic composition known in the art and further description is not believed necessary. Pins 13 are of a known copper material currently used in the art and further description of these is also not believed necessary. Although only two pins 13 are depicted in FIG. 1, the invention is not limited thereto. In one example of the invention, it is possible to use a total of about two hundred such pins. In one example, ceramic substrate 11 will possess a thickness (dimension "T" in FIG. 1) of about 0.060 inch, while pins 13 are each of cylindrical configuration, having an outer diameter of about 0.016 inch.

Significantly, pins 13, in addition to including a downwardly (lower) projecting end portion 15 which extends from an undersurface 17 of substrate 11, also include an upwardly projecting end portion 19 which extend upwardly from an opposite, upper surface 21 of the substrate. In one example of the invention, the downwardly projecting end portions 15 of pins 13 extended a distance of about 0.180 inch from undersurface 17, as is typically known in the art. Accordingly, these downwardly projecting end portions 15 are adapted for being positioned within a conductive opening 23 of a separate circuit member 25. A preferred example of such a circuit member 25 is a multilayered printed circuit board of types well known in the art. Such boards typically include a dielectric 27 (e.g., fiberglass reinforced epoxy resin) and a plurality of conductive planes 29 (e.g., copper) spacedly positioned therein for providing desired operational capabilities (e.g., signal, power, ground). Pins 13 are thus electrically coupled to respective ones of these conductive layers when positioned within conductive openings 23. Circuit member 25 thus represents a circuitized substrate to which the rigid first substrate 11 can be electrically coupled. This second substrate 25 is also, preferably, of substantially rigid configuration. In one example of the invention, substrate 25, being a multilayered circuit board as mentioned, possessed a thickness of about 0.062 inch.

Each of the conductive openings 23 described above is preferably a plated through hole of a type known in the art. Such plated through holes typically are drilled within the multilayered circuit board at appropriate, designated locations and then internally coated with a suitable conductive material (e.g., copper), as represented by the numeral 31.

It is also within the teachings of the present invention to include various separate conductive layers (or planes) within the rigid ceramic substrate 11, which layers may also be individually coupled to respective ones of pins 13, if desired. Such conductive layers (not shown) may also be of copper material as are layers 29 in the second substrate 25. In a preferred embodiment of the invention, the first substrate 11 will include at least one conductive layer 33, this conductive layer forming a circuit for performing desired electrical functions for package 10. Conductive layer (circuitry) 33 is preferably only about 0.0003 inch thick and is deposited on a suitable dielectric (e.g., polyimide) 35, which dielectric in turn is located on upper surface 21. Dielectric 35, in on example, possessed a thickness of about 0.0004 inch. Ideally, an initial metallized layer (not shown) is provided on the ceramic's upper surface and dielectric 35 then added. One example of such an initial layer is chrome-copper having a thickness of only about 0.00016 inch. The use of individual conductive layers of circuitry on respective dielectric layers atop ceramic or the like substrates, including those of the pinned variety, is known and further description is not believed necessary.

In accordance with the teachings of the invention, package 10 includes the aforedefined upwardly projecting end portions 19 of pins 13 which extend above the upper surface 21 (and also the upper surface of circuitized layer 33 located on dielectric 35). As shown in FIG. 1, these upwardly extending end portions 19 are specifically designed to accommodate at least one, and preferably several, individual thin film, flexible circuitized substrates 41 (the three being shown in FIG. 1), which are electrically coupled to these end portions of pins 13 as desired, such that said flexible substrates are in turn electrically coupled to respective circuitry within/upon the first substrate 11 and/or the second substrate 25.

Each of the thin film, flexible circuitized substrates includes at least one layer of dielectric 43 (e.g., polyimide) and an attached conductive layer 45 (e.g., copper or chrome-copper-gold). The preferred overall thickness for each substrate is only from about 0.004 inch to about 0.005 inch, thus assuring the flexibility desired herein. Electrically coupled to each substrate 41 is a semiconductor device 47 (chip) which, as shown in FIG. 1, is electrically coupled to an internal portion of the circuitry 45. A preferred method of coupling devices 47 is to use what is referred to in the art as C4 solder connections. C4 stands for controlled collapse chip connection, and is now a well known technology in the art, said technology having been developed by the assignee of the present invention. A plurality of individual solder elements 49 are shown in FIG. 1 for illustration purposes. As further seen in FIG. 1, it is also preferred that these solder connectors for each semiconductor device 47 be encapsulated with a suitable encapsulant 51. It is also possible when using such encapsulant to cover the upper surface 53 of the device. There presently exist several encapsulants in the art for this purpose and further description thereof is not deemed necessary at this time. If encapsulant is located on the upper surface of each semiconductor device, such encapsulant may possess a thickness of only about 0.010 inch. Encapsulant 51 is, of course, dielectric.

In the structure depicted in FIG. 1, the three thin film, flexible circuitized substrates 41 are arranged in stacked orientation, one atop the other, on the respective upwardly projecting end portions 19 of pins 13. As also shown, the dielectric layers 43 of each substrate rest atop either the described encapsulant covering 51 (if used) located on a lower semiconductor device 47 or, in the case of the bottom circuitized substrate 41, atop the circuitry 45 on substrate 11. If no encapsulant is used atop each device, each flexible substrate may rest directly on the upper surface of the respective device located therebelow. Thus it is understood that each respective circuitized substrate is electrically insulated from any possible conductive surfaces of the nearest, adjacent flexible substrate or the circuitry on substrate 11.

Although the embodiment of FIG. 1 illustrates that only one semiconductor device 47 is provided for each circuitized substrate 41, it is of course understood that each such substrate may include additional semiconductor devices and/or other electrical components which in turn will enhance the operational capabilities for each substrate, and thus the present invention.

Figure 2:
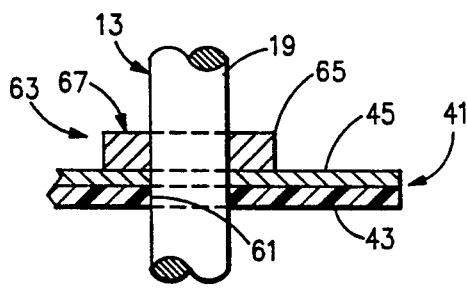
FIGS. 2 and 3 represent various steps in accomplishing electrical connection between the circuitry on the invention's thin film, flexible circuitized substrate and a corresponding conductive pin.
Figure 3:
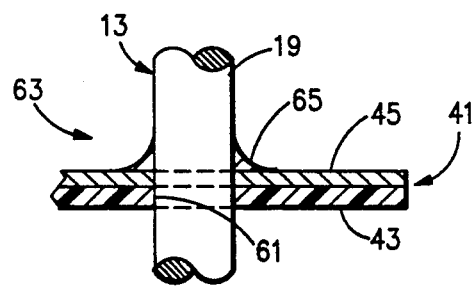

As also shown in FIG. 1, and further in FIGS. 2 and 3, each of the thin film, flexible circuitized substrates 41 includes at least two apertures 61 extending therethrough and designed for having a respective end portion 19 of a conductive pin 13 inserted therein. In one example of the invention, each aperture 61 possessed an internal diameter of from about 0.023 inch to about 0.025 inch, to thus provide a relatively loose fit onto the respective copper pins. Such a loose fit serves to substantially prevent tearing of the relatively thin, flexible substrates. In order to electrically couple the respective circuitry 45 on each substrate 41 to pins 13 in the region of apertures 61, means 63 is provided. In a preferred embodiment of the invention, means 63 comprises a quantity of solder 65 which is initially in the form of a hollow, cylindrical preform 67 (FIG. 2) which is then appropriately heated to reflow to the configuration depicted in FIG. 3, thus providing an effective connection to the adjacent circuitry 43 about aperture 61. In one example of the invention, each solder preform 67 was, as described, of a cylindrical configuration and possessed an outer diameter of about 0.040 inch and a corresponding internal diameter (for the internal hole thereof) of about 0.018 inch. As such, preform 67 was readily positioned on the respective thin film, flexible circuitized substrates in a sequential fashion during the stacking of substrates 41 on pins 13. Further, the apertures 61 are also plated with a suitable conductor (e.g., copper) for enhanced connection purposes. Such a conductor is not shown in the drawings. However, use of such plated-through-holes is well known in the art. Further description is not believed necessary.

In the embodiment depicted in FIG. 1, pins 13 preferably extended a distance of only about 0.120 inch above the upper surface 21 of substrate 11, thus assuring a relatively minimal height on the ceramic substrate. At this dimension, the pins were specifically adapted for receiving a total of the three flexible circuitized substrates 41 as shown in FIG. 1. It is again worth mentioning, however, that the invention is not limited to only three such substrates in that the pins can be extended beyond this dimension to in turn accommodate additional such substrates.

The preferred method of assembling package 10 involves initially positioning a singular flexible circuitized substrate 41 atop pins 13 and against the upper, conductive circuitry 45. Solder preforms 67 are then added atop this first circuitized substrate, following which a second circuitized substrate 41 is positioned. Additional solder preforms are then added to this second substrate 41 and a third substrate then also added atop this combined structure. A third grouping of solder preforms is then added to this third substrate. At this time, suitable heat is applied to package 10 to reflow the solder preforms 67 and effect appropriate connection with the designated, adjacent circuitries 45. Significantly, it is preferred to use hydrogen as the heat source (hot gas) to accomplish this solder reflow. Hydrogen is preferred because of its ability to remove oxides from the surfaces of the metals by forming gaseous water. Accordingly, use of such hydrogen precludes the requirement for using conventional fluxes or the like, in addition to removing the need for post-soldering cleaning. This constitutes a significant advantage in today's environment.

In the present invention, it is preferred to use a solder hierarchy, wherein at least two different solders, each possessing a different melting point, are used. In a preferred example, a first solder was used to join each of the semiconductor devices 47 to a respective circuitized substrate 41, which first solder possessed a different melting point than the solder used for preforms 67. By way of specific example, a 3:97 (tin:lead) solder, having a melting point of about 318 degrees Celsius (C.) was used to join the semiconductor devices 47 to the circuitry on each substrate 41, while a 50:50 (tin:lead) solder, having a melting point of about 248 degrees C., was used to join the flexible circuitized substrates 41 to pins 13 in the region of apertures 61. Use of a higher melting point solder for bonding the respective semiconductor devices to the flexible circuitized substrates, in addition to applying the heated hydrogen at a temperature below the melting point of this solder yet above the melting point of the solder preforms 67, thus assures that the aforementioned reflow of preforms 67 will satisfactorily occur without adversely affecting the relatively delicate solder joints formed between the invention's semiconductor devices and flexible substrates.

It is also preferred in the present invention to use an even lower melting point solder, if desired, to coat the downwardly projecting portions 15 of pins 13 so as to enhance the electrical connection between these portions and the conductive apertures 23 in substrate 25. In one example, a 63:37 (tin:lead) solder, having a melting point of about 183 degrees C., was used. Understandably, this lower melting point solder may also reflow during hydrogen heating of package 10 when heating the aforementioned solder preforms 67, provided the hot gas is directed in such a manner so as to cause such heating (see below). (Such heating will occur, of course, if the invention is placed in a hot air oven for this purpose.) This heating step is considered advantageous for the reasons stated.

In a preferred embodiment of the invention, package 10 was heated in a hydrogen furnace to achieve the solder reflow of preforms 67 (and the lower pin portion solder, if used). A continuous hydrogen belt furnace is preferred, various types of which are known on the market. Preferably, this furnace, during heating, should contain less than 10 ppm (part per million) oxygen, and preferably none of this gas. The furnace atmosphere should also be less than 50 ppm moisture, with no moisture preferred. Hydrogen flow is preferably from about 175 to 210 standard cubic feet per hour (for a six inch by six inch cross-section belt furnace), which gas is injected into the middle of the furnace (at the highest temperature zone). For the various materials defined herein, the furnace should attain a temperature within the range of from about 250 degrees C. to about 300 degrees C., the preferred temperature about 275 degrees C. Understandably, this is above the melting point temperature of the 50:50 solder mentioned above, but less than that of the 3:97 solder. One known example of such a furnace is about 216 inches long, and provides a conveyor speed of about five to fifteen inches per minute, the preferred rate for the present invention being about eleven inches per minute. During such heating, the package 10 is positioned within the lower substrate 25, both of said components being positioned within the furnace. Alternatively, it is possible to direct hot gas onto the solder preforms using strategically positioned nozzles to accomplish this heating.

Figure 4:
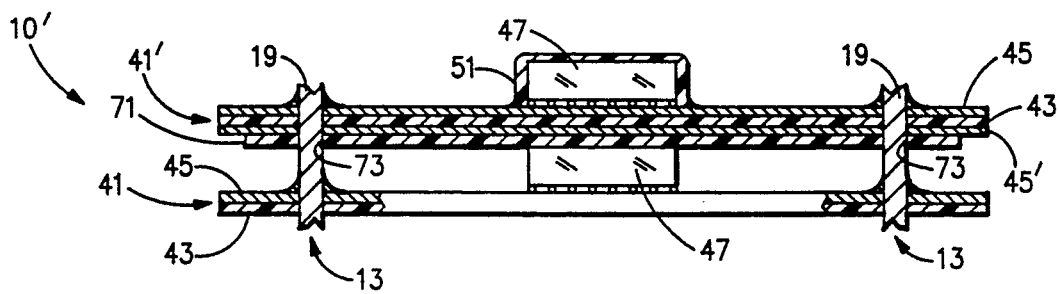
FIG. 4 is a partial, elevational view of an electronic package in accordance with another embodiment of the invention.

In FIG. 4, there is shown a partial view of an electronic package 10' in accordance with an alternate embodiment of the invention. Package 10' differs from that of package 10 in FIG. 1 in that the aforementioned encapsulant coating on at least one of the semiconductor devices 47 is not provided. To assure effective electrical and thermal insulation between this uncoated device and the nearest, above circuitized substrate 41, a relatively thin layer of dielectric material 71 is provided. In one example of the invention, this dielectric material 71 comprised a 0.002 inch thick layer of polyimide, said layer including apertures 73 at the end thereof designed to accommodate the respective projecting end portions 19 of pins 13. This structure as shown in FIG. 4 thus assures an alternative means for assembling the invention wherein it may not be desired to use encapsulant or the like atop one or more of the invention's semiconductor devices 47. This embodiment is particularly adapted to the use of thin film, flexible circuitized substrates 41' which include a lower (second) conductive (e.g., ground) layer 45' as part thereof. Such a layer 45', as shown in FIG. 4, may be located on the opposite side of dielectric 43 from the above, circuitized layer 45, and may function in a ground or similar capacity. Use of the defined dielectric member 71 thus assures prevention of electrical shorting between the lower conductive layer 45' and device 47 located thereunder. Other elements of the package 10' similar to those described in FIG. 1 are utilized.

Thus there has been shown and described a new and improved electronic package which combines the advantageous features of high density, thin film flexible circuitized substrates with earlier technology relating to pinned, rigid substrates (e.g., ceramic). The article as described herein and produced in accordance with the unique teachings included herein is believed to constitute a significant advancement in the art as a result of this combination. For example, the invention is adaptable for utilization in many current information handling systems (computer) environments in order to meet the stringent, high density requirements thereof. In addition, the invention is adaptable for being produced on a relatively large scale (mass production), and thus benefits from the several advantages (e.g., relatively low cost) thereof.

While there have been shown and described what are at present the preferred embodiments of the invention, it will be obvious to those skilled in the art that various changes and modifications may be made therein without departing from the scope of the invention as defined by the appended claims. For example, increased wireability of each of the invention's thin film circuitized substrates can be attained for those substrates including more than one conductive layer through use of appropriate interconnecting means (e.g., conductive via holes, conductive pins having smaller diameters than those described above, etc.) to interconnect said conductive layers.

What is claimed is:

1. A method of making an electronic package, said method comprising:
    providing a substantially rigid first substrate including a first surface and at least two electrically conductive pins spacedly located therein, said pins including at least one end portion projecting above said first surface;
    positioning a plurality of individual thin film, flexible circuitized substrates in stacked and electrically insulated orientation above said first surface of said first substrate on said projecting end portions of said conductive pins, selected ones of said circuitized substrates including at least one dielectric layer, at least one layer of circuitry on said dielectric layer and at least one semiconductor device positioned on an upper surface of said substrate and electrically coupled to said circuitry, said semiconductor devices being positioned on said upper surfaces of said flexible circuitized substrates and electrically coupled to said circuitry prior to said positioning of said flexible substrates on said pins in said stacked and electrically insulated orientation, said selected ones of said circuitized substrates including at least two apertures therein adapted for having a respective one of said projecting end portions of said pins located therein; and thereafter
    electrically connecting said circuitry of said circuitized substrates to said projecting end portions of said conductive pins in the region of said apertures.

2. The method according to claim 1 wherein said electrically connecting said circuitry to said pins comprises providing a plurality of solder preforms on said conductive pins relative to said apertures in each of said thin film, flexible circuitized substrates.

3. The method according to claim 2 further including heating said solder preforms to effect reflow thereof into said region of said apertures.

4. The method according to claim 3 wherein said heating is accomplished using hot gas.

5. The method according to claim 4 wherein said hot gas is hydrogen, said reflow of said solder preforms occurring without the use of flux or the like materials.

6. The method according to claim 1 including providing at least one of said thin film, flexible circuitized substrates with a second layer of circuitry located on an opposite surface of said dielectric layer from said one layer of circuitry.

7. The method according to claim 6 further including providing electrically insulative means between said semiconductor device of one of said thin film, flexible circuitized substrates and said second layer of circuitry of said one of said thin film, flexible circuitized substrates having said second layer of circuitry thereon.

8. The method according to claim 1 wherein said electrically connecting of said circuitry of said thin film, flexible circuitized substrates to said projecting end portions of said conductive pins comprises providing a plurality of solder preforms on said conductive pins relative to said apertures in each of said thin film, flexible circuitized substrates.

9. The method according to claim 8 further including providing a second solder material for electrically coupling said semiconductor devices to respective ones of said thin film, flexible circuitized substrates, said second solder material having a different melting point temperature than said solder material electrically connecting said flexible circuitized substrates to said projecting end portions of said conductive pins.

10. The method according to claim 1 further including providing at least one layer of circuitry on said first surface of said first substrate.

* * * * *